(12) United States Patent
Thokachichu et al.

(10) Patent No.: US 10,923,334 B2
(45) Date of Patent: Feb. 16, 2021

(54) SELECTIVE DEPOSITION OF HARDMASK

(71) Applicant: Applied Materials, Inc., Santa Clara, CA (US)

(72) Inventors: Satya Thokachichu, San Jose, CA (US); Edward P. Hammond, IV, Hillsborough, CA (US); Viren Kalsekar, Sunnyvale, CA (US); Zheng John Ye, Santa Clara, CA (US); Sarah Michelle Bobek, Santa Clara, CA (US); Abdul Aziz Khaja, San Jose, CA (US); Vinay K. Prabhakar, Cupertino, CA (US); Venkata Sharat Chandra Parimi, Sunnyvale, CA (US); Prashant Kumar Kulshreshtha, San Jose, CA (US); Kwangduk Douglas Lee, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 19 days.

(21) Appl. No.: 16/403,489

(22) Filed: May 3, 2019

(65) Prior Publication Data
US 2019/0341227 A1 Nov. 7, 2019

Related U.S. Application Data

(60) Provisional application No. 62/666,418, filed on May 3, 2018.

(51) Int. Cl.
*H01J 37/32* (2006.01)
*H01L 21/683* (2006.01)
(Continued)

(52) U.S. Cl.
CPC ........ *H01J 37/32715* (2013.01); *C23C 16/46* (2013.01); *C23C 16/509* (2013.01);
(Continued)

(58) Field of Classification Search
CPC combination set(s) only.
See application file for complete search history.

(56) References Cited

U.S. PATENT DOCUMENTS

| | | |
|---|---|---|
| 7,312,162 B2 | 12/2007 | Ramaswamy et al. |
| 7,790,634 B2 | 9/2010 | Munro et al. |

(Continued)

FOREIGN PATENT DOCUMENTS

WO 2005/087974 A2 9/2005

OTHER PUBLICATIONS

International Search Report and Written Opinion dated Sep. 5, 2019 for Application No. PCT/US2019/028665.

*Primary Examiner* — Ratisha Mehta
(74) *Attorney, Agent, or Firm* — Patterson + Sheridan, LLP

(57) ABSTRACT

One or more embodiments described herein generally relate to selective deposition of substrates in semiconductor processes. In these embodiments, a precursor is delivered to a process region of a process chamber. A plasma is generated by delivering RF power to an electrode within a substrate support surface of a substrate support disposed in the process region of the process chamber. In embodiments described herein, delivering the RF power at a high power range, such as greater than 4.5 kW, advantageously leads to greater plasma coupling to the electrode, resulting in selective deposition to the substrate, eliminating deposition on other process chamber areas such as the process chamber side walls. As such, less process chamber cleans are necessary, leading to less time between depositions, increasing throughput and making the process more cost-effective.

23 Claims, 3 Drawing Sheets

(51) Int. Cl.
  *C23C 16/46* (2006.01)
  *C23C 16/509* (2006.01)
  *H01L 21/02* (2006.01)
  *H01L 21/285* (2006.01)

(52) U.S. Cl.
  CPC .. *H01J 37/32082* (2013.01); *H01J 37/32091* (2013.01); *H01J 37/32724* (2013.01); *H01L 21/02274* (2013.01); *H01L 21/02636* (2013.01); *H01L 21/28506* (2013.01); *H01L 21/6831* (2013.01); *H01J 2237/2007* (2013.01); *H01J 2237/332* (2013.01)

(56) References Cited

U.S. PATENT DOCUMENTS

| | | |
|---|---|---|
| 10,125,422 B2 | 11/2018 | Chen et al. |
| 2006/0219169 A1 | 10/2006 | Chen et al. |
| 2007/0032054 A1 | 2/2007 | Ramaswamy et al. |
| 2009/0053836 A1 | 2/2009 | Pipitone et al. |
| 2009/0104774 A1* | 4/2009 | Furukawa ......... H01L 21/02203 438/680 |
| 2013/0210199 A1 | 8/2013 | Chen et al. |
| 2014/0034612 A1 | 2/2014 | Yang et al. |
| 2014/0290576 A1 | 10/2014 | Chen et al. |
| 2015/0024515 A1 | 1/2015 | Hoffman et al. |
| 2016/0013064 A1* | 1/2016 | Kim ................. H01J 37/32165 438/714 |
| 2017/0069464 A1* | 3/2017 | Ye ....................... C23C 16/5096 |
| 2017/0162417 A1 | 6/2017 | Ye et al. |
| 2018/0358222 A1 | 12/2018 | Venkatasubramanian et al. |

\* cited by examiner

SELECTIVE DEPOSITION OF HARDMASK

CROSS-REFERENCE TO RELATED APPLICATIONS

This application claims priority to U.S. Provisional Patent Application No. 62/666,418, filed May 3, 2018, which is herein incorporated by reference.

BACKGROUND

Field

One or more embodiments described herein generally relate to semiconductor deposition processes, and more particularly, to methods for selective deposition of substrates in semiconductor processes.

Description of the Related Art

Deposition of thin film on a substrate surface is an important process in a variety of industries. In the semiconductor industry, in particular, as integrated circuit (IC) architecture becomes more complex, controlling the performance of each thin film layer is critical. As a result, various technologies have been developed to deposit layers on substrates in a cost-effective manner, while maintaining control over the characteristics of the layer. Chemical vapor deposition (CVD) is one of the most common deposition processes employed for depositing layers on a substrate. CVD is a flux-dependent deposition technique that requires precise control of the power. More specifically, in capacitively coupled plasma driven deposition systems, radio frequency power is controlled. Additionally important to maintaining characteristics of the deposited film are temperature and the precursors introduced into the process chamber in order to produce a desired layer of uniform thickness.

In conventional reactors, deposition coats the substrate and the interior reactor body. Thickness, uniformity, and defect stability of the deposition process requires that reactor surfaces are consistent and controlled. Reactor surfaces are commonly stabilized by a removal treatment, where the film which was deposited on the substrate is removed from the reactor surfaces. The removal treatment of film deposition and chamber treatment is commonly referred to as cleaning. Correct implementation of removal treatment is important in IC fabrication to maintain consistent etch selectivity, etch critical dimension uniformity, lithographic overlay, and lithographic defocus. Insufficient removal treatment results in device loss. Maximizing utilization, from a cost perspective, favors high throughput of the film deposition and reactor treatment clean. When the reactor surfaces are required to be cleaned often, film deposition throughput drops, increasing manufacturing cost. In conventional CVD processes, more unproductive time removing deposition from the reactor interior is required due to inadequate plasma coupling during the film deposition process.

Accordingly, there is a need for methods for controlling the plasma coupling during deposition processes, leading to controlled depositions onto substrates.

SUMMARY

One or more embodiments herein relate to methods for selective deposition of substrates in semiconductor processes.

In one embodiment, a method of forming a layer on a substrate includes delivering a precursor to a process region of a plasma process chamber; generating a plasma comprising the precursor over the substrate positioned on a substrate support surface of a substrate support disposed in the process region of the process chamber by delivering an RF power at a first RF frequency and a magnitude to a first electrode, wherein: the generated plasma causes an RF current to flow from a second electrode disposed within the substrate support to a first conductor, the RF current then flows from the first conductor to a second conductor and a first capacitor that has a first capacitance, the second conductor and the first capacitor are both coupled in parallel to ground, the first conductor is capacitively coupled to ground through a second capacitance, and the magnitude of the RF power at the first RF frequency is greater than 4.5 kW.

In another embodiment, a method of forming a layer on a substrate includes delivering a precursor to a process region of a process chamber; applying heat to the substrate positioned on a substrate support surface of a substrate support disposed in the process region of the process chamber; generating a plasma comprising the first precursor over the substrate positioned on the substrate support surface of the substrate support disposed in the process region of the process chamber by delivering an RF power at a frequency and a magnitude to a first electrode, wherein: the generated plasma causes an RF current to flow from a second electrode disposed within the substrate support to a first conductor, the RF current then flows from the first conductor to a second conductor and a first capacitor that has a first capacitance, the second conductor and the first capacitor are both coupled in parallel to ground, the first conductor is capacitively coupled to ground through a second capacitance, and the magnitude of the RF power at the frequency is greater than 4.5 kW and a temperature of the heating sources is greater than 550 degrees Celsius.

In another embodiment, a method of forming a layer on a substrate includes (a) delivering a precursor to a process region of a process chamber; (b) applying heat to the substrate positioned on a substrate support disposed in the process region of the process chamber; (c) generating a plasma comprising the first precursor over the substrate positioned on the substrate support disposed in the process region of the process chamber by delivering an RF power at a frequency and a magnitude to a first electrode, wherein: the generated plasma causes an RF current to flow from a second electrode disposed within the substrate support to a first conductor, the RF current then flows from the first conductor to a second conductor and a first capacitor that has a first capacitance, the second conductor and the first capacitor are both coupled in parallel to ground, the first conductor is capacitively coupled to ground through a second capacitance, and the magnitude of the RF power at the frequency is greater than 4.5 kW and a temperature of the heating sources is greater than 550 degrees Celsius; (d) turning off the RF power; and repeating processes (a)-(d) more than two times.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

One or more embodiments described herein generally relate to selective deposition of substrates in semiconductor processes. In these embodiments, a precursor is delivered to a process region of a process chamber. A plasma is generated by delivering RF power to an electrode within a substrate support surface of a substrate support disposed in the process region of the process chamber. In embodiments described herein, delivering the RF power at a high power range, such as greater than 4.5 kW, advantageously leads to greater plasma coupling to the electrode, resulting in selective deposition to the substrate, eliminating deposition on other process chamber areas such as the process chamber side walls. Selective deposition of film on the electrode surfaces also greatly reduces or eliminates arcing on components at the periphery of the process chamber body. As such, less process chamber cleans are necessary, leading to less time between deposition, increasing throughput and making the process more cost-effective. Additionally, controlling other process variables relative to the RF power such as temperature, pressure, and flow rate can also help achieve desired results.

Figure 1:
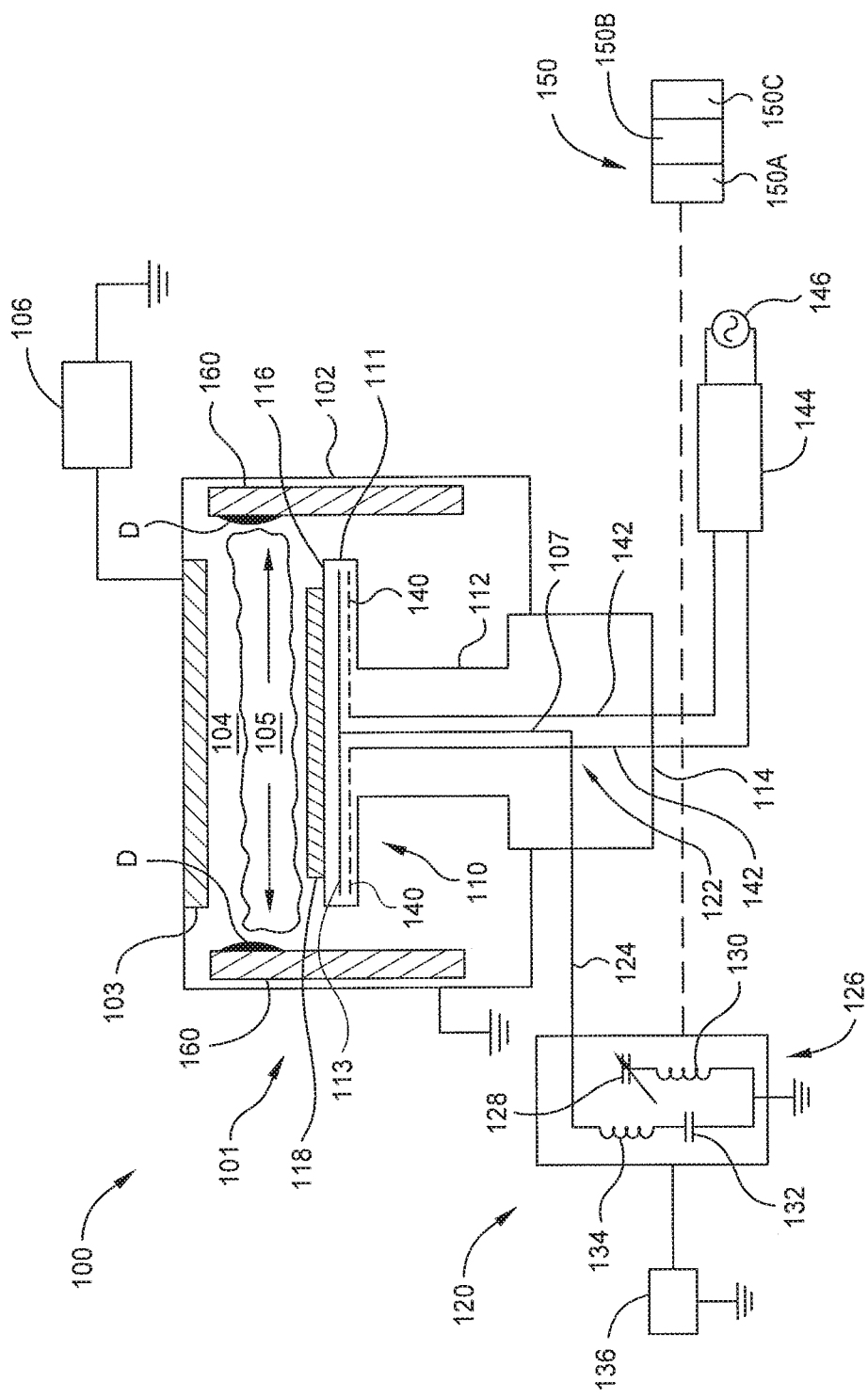
FIG. 1 is a sectional view of a process system with a conventional RF grounding configuration.

FIG. 1 is a sectional view of a process system 100 with a conventional RF grounding configuration 120. The process system 100 includes a process chamber 101. The process chamber 101 includes a chamber body 102 at least partially defining a process volume 104. A pedestal 110 is disposed in the process volume 104. The conventional RF grounding configuration 120 is coupled to the pedestal 110. An electrode 103 is disposed opposite the pedestal 110. In embodiments described herein, the electrode 103 is a showerhead. The showerhead is configured to deliver precursor gases into the process volume 104 in a controlled manner. An RF power source 106 is coupled to the electrode 103 to facilitate a plasma 105 within the process chamber 101. Power from the RF power source 106 is capacitively coupled to the pedestal 110 during processing.

The pedestal 110 includes a substrate support 111 disposed at an upper end of a support shaft 112. The substrate support 111 is formed of a ceramic material, such as aluminum nitride, while the support shaft 112 is formed of a metal, such as aluminum, or a ceramic, such as aluminum nitride. A substrate 118 is positioned on a substrate support surface 116 of the substrate support 111. An electrode 113, such as an RF mesh, is disposed in the substrate support 111 to facilitate the plasma 105 within the process chamber 101. Heating elements 140 are disposed in the substrate support 111 to facilitate temperature adjustment of the substrate support 111, and therefore the substrate support surface 116 and substrate 118. The heating elements 140 generally provide resistive heating to the substrate support 111. The heating elements 140 are connected to one or more conductive rods 142, which may extend along the length of the support shaft 112 of the pedestal 110. The conductor rods 142 couple the heating elements 140 to a heating power source 146, through one or more heater RF filters 144. The heater RF filters 144 are generally configured to block RF energy from reaching the heating power source 146. The heating power source 146 provides a non-RF, alternating current (AC) power to the heating elements 140.

In the conventional RF grounding configuration 120, an RF rod 107 is coupled to the electrode 113 and extends through the support shaft 112 of the pedestal 110 to an RF filter 114. The RF filter 114 includes an RF strap 122 therein, which couples the RF rod 107 to an RF cable 124. The RF cable 124 is connected to a bottom tuner 126. The bottom tuner 126 includes a variable capacitor 128 and an inductor 130, which are disposed in parallel to a fixed capacitor 132 and an inductor 134. A high voltage direct current (HV DC) power supply 136 facilitates conduction of HV DC current through the RF cable 124, and to the pedestal 110 and the electrode 113. The power supply 126 inputs power to facilitate operation of an electrostatic chuck (not shown) located within the pedestal 110. In the conventional RF grounding configuration 120, all the RF current conducted from the pedestal 110 is grounded to a body of the process chamber 101 through the bottom tuner 126, which is in turn connected to an RF power generator ground. In such a configuration, RF current at 13.56 MHz inside the bottom tuner 126 is about 25 A (rms).

As such, the high RF current at the bottom tuner 126 can result in excessive heating of the RF cable 124. Therefore, high RF power cannot be applied to the RF cable 124 without parts degradation, which means high RF power cannot be applied to the process system 101. Without high RF power being applied to the process system 101, desirable results cannot be obtained. For example, at lower RF power, less plasma coupling occurs, leading to a less focused deposition. Instead, as shown in FIG. 1, the plasma 105 spreads outwards to walls of chamber liners 160. As such, material deposits, indicated by D in FIG. 1, form on the walls of the chamber liners 160. Due to the material deposits, the process chamber 101 must be cleaned often to remain in a stable condition for processing, decreasing throughput and making the process less cost-effective. Additionally, if the process chamber 101 is not in a stable condition, it can lead to particle defects on the substrate 118 and cause process drift.

A controller 150 controls the functions of the various components within the process system 100. The controller 150 may include a central processing unit (CPU) 150A, memory 150B, and support circuits (or I/O) 150C. The CPU 150A may be one of any form of computer processors that are used in industrial settings for controlling various processes and hardware (e.g., motors, valves, power delivery components, and other related hardware) and monitor the processes (e.g., processing time and substrate position or location). The memory 150B is connected to the CPU 150A, and may be one or more of a readily available memory, such as random access memory (RAM), read only memory (ROM), floppy disk, hard disk, or any other form of digital storage, local or remote. Software instructions, algorithms and data can be coded and stored within the memory 150B for instructing the CPU 150A. The support circuits 150C are also connected to the CPU 150A for supporting the processor in a conventional manner. The support circuits 150C may include conventional cache, power supplies, clock circuits, input/output circuitry, subsystems, and the like. A program (or computer instructions) readable by the controller determines which tasks are performable within the process system 100.

Figure 2:
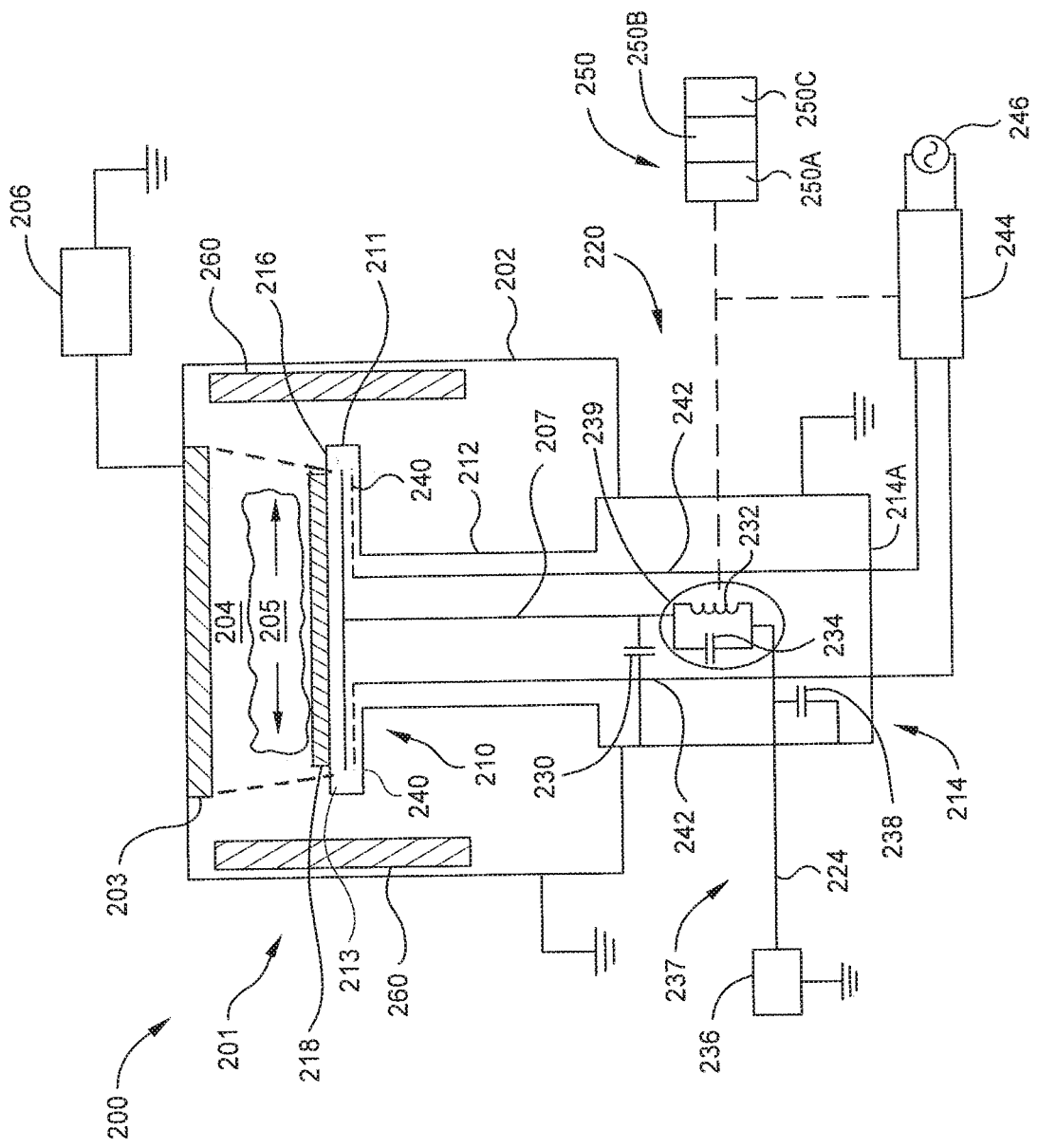
FIG. 2 is a sectional view of a process system with an RF grounding configuration according to at least one embodiment described herein.

FIG. 2 is a sectional view of a process system 200 with an RF grounding configuration 220 according to at least one embodiment described herein. The process system 200 includes a process chamber 201. The process chamber 201 includes a chamber body 202 at least partially defining a process volume 204. A pedestal 210 is disposed in the process volume 204. The RF grounding configuration 220 is coupled to the pedestal 210. An electrode 203 is disposed opposite the pedestal 210. In embodiments described herein, the electrode 203 is a showerhead. The showerhead is configured to deliver precursor gases into the process volume 204 in a controlled manner. An RF power source 206 is coupled to the electrode 203 to facilitate a plasma 205 within the process chamber 101. Power from the RF power source 206 is capacitively coupled to the pedestal 210 during processing.

The pedestal 210 includes a substrate support 211 disposed at an upper end of a support shaft 212. The substrate support 211 is formed of a ceramic material, such as aluminum nitride, while the support shaft 212 is formed of a metal, such as aluminum, or a ceramic, such as aluminum nitride. A substrate 218 is positioned on a substrate support surface 216 of the substrate support 211. An electrode 213, such as an RF mesh, is disposed in the substrate support 211 to facilitate the plasma 205 within the process chamber 201. Heating elements 240 are disposed in the substrate support 211 to facilitate temperature adjustment of the substrate support 211, and therefore the substrate support surface 216 and substrate 218. The heating elements 240 generally provide resistive heating to the substrate support 211. The heating elements 240 are connected to one or more conductive rods 242, which may extend along the length of the support shaft 212 of the pedestal 210. The conductor rods 242 couple the heating elements 240 to a heating power source 246, through one or more heater RF filters 244. The heater RF filters 244 are generally configured to block RF energy from reaching the heating power source 246. The heating power source 246 provides a non-RF, alternating current (AC) power to the heating elements 240.

In these embodiments shown in FIG. 2, the RF grounding configuration 220 is used in place of the RF grounding configuration 120 shown and described in FIG. 1. The RF grounding configuration 220 includes an RF filter 214. The RF filter 214 includes a capacitor 230 disposed in series with an LC resonant circuit 239. The LC resonant circuit 239 includes a capacitor 234 and an inductor 232 disposed in parallel with one another. An electrostatic chucking cable 237 conducts HV DC power from the HV DC power supply 236 through an RF cable 224 to the pedestal 210. A capacitor 238 couples the RF cable 224 to an electrically-conductive housing 214A of the RF filter 214.

As shown in FIG. 2, RF power, for example at a frequency of 13.56 MHz and at a magnitude of greater than 4.5 kW, is coupled through the plasma 205 in the process chamber 101 to the electrode 213 disposed within the substrate support 211. In some embodiments, the electrode 213 can be an RF mesh. The electrode 213 is connected to ground through an RF rod 207 via the capacitor 230. A capacitance of the capacitor 230 is selected such that the capacitor 230 provides a virtual ground to 13.56 MHz RF current, for example. Also, the capacitor 230 is chosen such that a heater-to-ground impedance matches a known value. The LC resonant circuit 239 facilitates blocking of any residual RF current flowing through the RF cable 224. The capacitor 238 facilitates grounding of the RF voltage across the RF cable 224 such that voltage (and thus the current) across the RF cable 224 is zero or nearly zero. The RF current conducted by the RF rod 207 is conducted through the first capacitor 230, to the electrically conductive (e.g., grounded) housing 214A, and then to internal surfaces of the electrically conductive (e.g., ground) chamber body 202 of the process chamber 201. RF current may then return to a ground of the RF power generator 206. In one example, at a frequency of 13.56 MHz, the RF current measured through a sensor at the output of the RF filter 214, is about 0.5 A (rms) in the RF grounding configuration 220.

In the RF ground configuration 220, the RF current flow through the RF cable 224 is greatly reduced compared to conventional approaches by directing RF power current flow to internal surfaces of the chamber body 202. In one example, RF power current flow through the RF cable 224 is reduced approximately 90% compared to conventional approaches. As such, the RF cable 224 can operate at a cooler temperature compared to conventional approaches, which means higher RF power can be applied to the process system 200. With high RF power being applied to the process system 200, a greater amount of plasma coupling occurs, leading to a more focused deposition. As shown in FIG. 2, the plasma 205 is focused towards the electrode 213 and substrate 218, and does not spread as far outwards to walls of the chamber liners 260 as the plasma 105 does in FIG. 1. As such, material deposits generally do not form on the walls of the chamber liners 260. Due to the reduced material deposits across the process chamber 201, the process chamber 201 does not have to be cleaned as often to remain in a stable condition for processing, increasing throughput and making the process more cost-effective. Additionally, it can lead to less particle defects on the substrate 218 and reduced process drift.

A controller 250 controls the functions of the various components within the process system 200. The controller 250 may include a central processing unit (CPU) 250A, memory 250B, and support circuits (or I/O) 250C. The CPU 250A may be one of any form of computer processors that are used in industrial settings for controlling various processes and hardware (e.g., motors, valves, power delivery components, and other related hardware) and monitor the processes (e.g., processing time and substrate position or location). The memory 250B is connected to the CPU 250A, and may be one or more of a readily available memory, such as random access memory (RAM), read only memory (ROM), floppy disk, hard disk, or any other form of digital storage, local or remote. Software instructions, algorithms and data can be coded and stored within the memory 250B for instructing the CPU 250A. The support circuits 250C are also connected to the CPU 250A for supporting the processor in a conventional manner. The support circuits 250C may include conventional cache, power supplies, clock circuits, input/output circuitry, subsystems, and the like. A program (or computer instructions) readable by the controller determines which tasks are performable within the process system 200.

Figure 3:
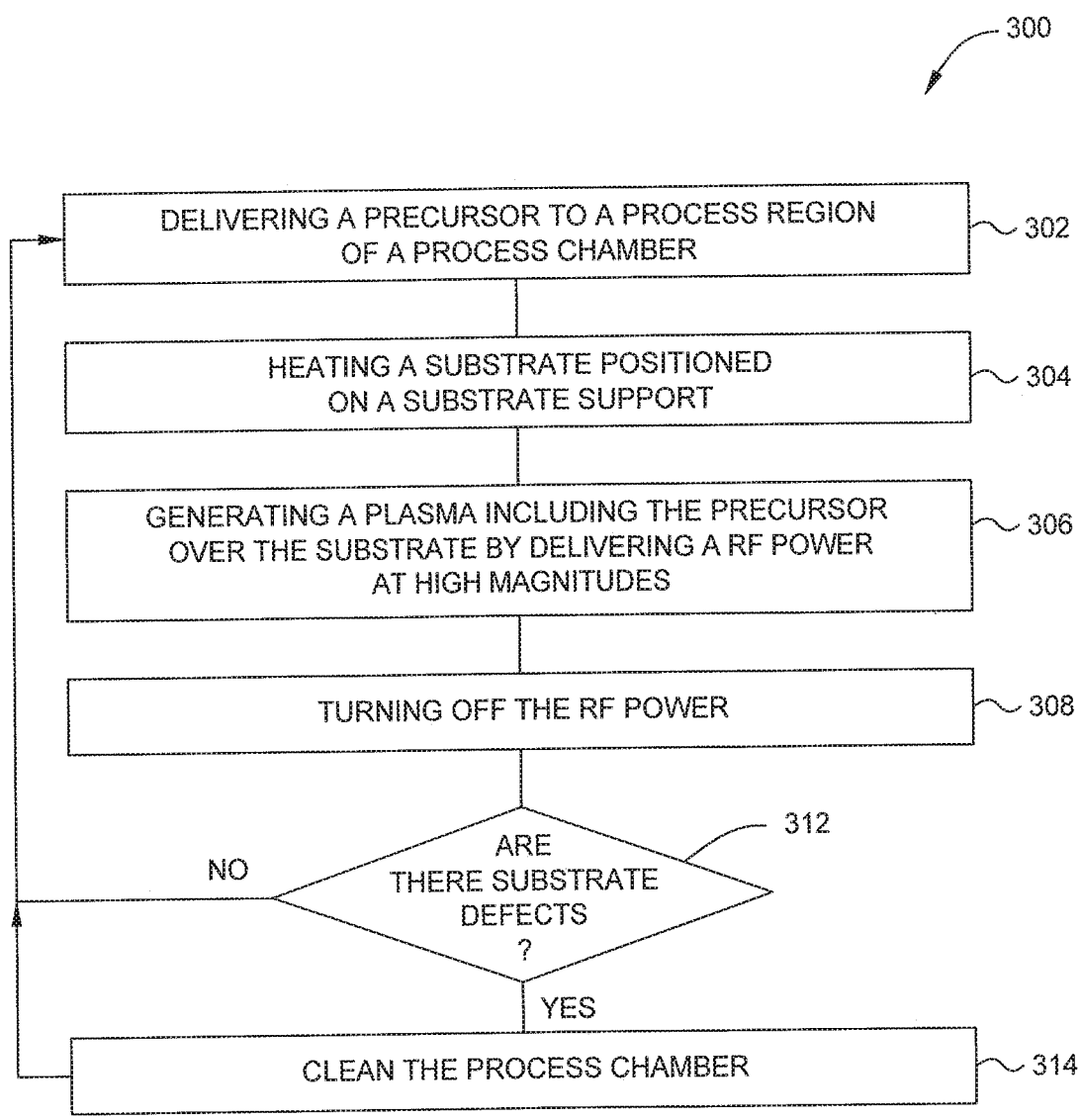
FIG. 3 is a flow chart of a method according to at least one embodiment described herein.

FIG. 3 is a flow chart of a method 300 according to at least one embodiment described herein. In these embodiments, the method 300 is performed with the device described in FIG. 2, but is not limited to this device and can be performed with other similar devices. In block 302, a precursor is delivered to the process region 204 of the process chamber 201 through the showerhead. The precursor gases can include $C_2H_4$, He, $N_2$, $NH_3$, $WF_6$, $C_3H_6$, Ar, $SiH_4$, $H_2$ and/or other similar gases. In block 304, heat is applied to the substrate 218 positioned on the substrate support 211 disposed in the process region 204 of the process chamber 201. The heat is generated from the heating power source 246, which provides a non-RF, alternating current (AC) power to the heating elements 240 as discussed above. In some embodiments, the substrate support 211 may be heated to greater than about 550 degrees Celsius, for example. The high temperatures reduce the insulating properties of the pedestal 210, facilitating a more focused deposition, which is believed to be due to a change in impedance through the substrate support 211.

In block 306, the plasma 205 is generated by delivering an RF power to the electrode 203 while flowing the precursor into the process region 204. The plasma 205 is directed toward the substrate 218 that is positioned on the substrate support surface 216 of the substrate support 211. In some embodiments, the magnitude of the RF power at a frequency of 13.56 MHz can be greater than about 3.5 kW, for example. In other embodiments, the RF power at a frequency of 13.56 MHz can be greater than about 4.5 kW, or greater than 6 kW, or even greater than 6.5 kW, for example. The pressure and total top flow rate (e.g., flow rate through the showerhead) can be also controlled relative to the RF power provided to the processing region of the process chamber 201. In some embodiments, the ratio of the pressure (Torr) to the RF power (W) is between about 0.0020 to about 0.0035. In other embodiments, the ratio of the total top flow (sccm) to the RF power (W) is between about 0.5 to about 0.7.

The high RF power causes RF capacitive coupling of the electrode 203 and the electrode 213, which leads to a more focused deposition onto the substrate 218, preventing materials from depositing onto the chamber liners 260. Additionally, the higher RF power results in a decrease in deposition time to half or ⅓rd from conventional process regimes due to an increased deposition rate. The increased deposition rate can be attributed to more species in the plasma 205 being adsorbed on the electrode 213 via high sticking coefficients due to a high conversion ratio to $C_xH_y$. Coupling due to the plasma 205 increases the effect, resulting in preferential consumption of carbon-species for deposition at the exposed surfaces at or overlying the electrodes 203 and 213 (e.g., substrate surface) rather than on the chamber body 202.

During processing, the generated plasma 205 causes an RF current to flow from the electrode 213 disposed within the substrate support 211 to the RF rod 207. The RF current then flows from the RF rod 207 to the RF cable 224 and to the capacitor 238. The RF cable 224 and the capacitor 238 are both coupled in parallel to ground. Additionally, the RF rod 207 is capacitively coupled to ground through the capacitor 230. The capacitor 238 facilitates grounding of the RF voltage across the RF cable 224 such that voltage (and thus the current) across the RF cable 224 is zero or nearly zero, allowing for a higher RF power to applied to the process system 200 as discussed above.

In block 308, the RF power is turned off. Optionally, when the RF power is turned off, the substrate 218 can be tested for defects. In some embodiments, there can be a predetermined number of substrates that are processed before the substrates are checked for defects. The predetermined number can be based on the typical number of substrates that are processed (e.g., deposition cycles) before defects begin to occur. For example, more than two, more than five, more than ten or more than 100 substrates can be processed before checking for defects, or the chamber is taken down for cleaning due to a concern about defects formed on a processed substrate. Using a predetermined number saves time compared to checking every deposited substrate for defects.

In block 312, after processing a certain number of substrates, it is determined whether or not a deposited substrate has defects. If the deposited substrate does not have defects, then the method 300 returns to block 302. In some cases, the chamber is cleaned after a safe number of substrates (N) have been processed in the chamber, without checking the amount of defects that were created on a substrate. The "safe number" of substrates N is the maximum number of substrates that can be processed before the defect level on a substrate processed in the process chamber reaches an unacceptable level. If less than N number of substrates have been processed in the process chamber then the method 300 returns to block 302. If, however, N number of substrates have been processed in the chamber then the method 300 moves to block 314.

If the deposited substrate does have defects, or the safe number of processed substrates (i.e., N substrates) has been reached in the process chamber, then the method 300 proceeds to block 314. In block 314, the process chamber 201 is cleaned, providing a stable chamber environment for further depositing substrates. As discussed above, in these embodiments, fewer chamber cleans are required in the method 300 compared to conventional processes.

The method 300 provides many benefits, in part due to the process parameters applied in the method 300, such as the high RF power and high temperature. For example, in these embodiments, the process parameters lead to a more focused deposition of materials onto the substrate 218. A more focused deposition causes less material deposits on other areas of the process chamber 201, including the chamber liners 260. Less material deposits across the process chamber 201 leads to fewer chamber cleans being necessary. Fewer chamber cleans decrease the amount of time needed to process multiple substrates, increasing throughput and leading to more cost-effective processes. Also, in some embodiments, by applying the process parameters, the deposition rate and throughput is increased by more than three times over conventional processes. In one example, the throughput is increased to about 20 wafers per hour per heater. The focused deposition also leads to fewer defects across the substrate.

While the foregoing is directed to implementations of the present invention, other and further implementations of the invention may be devised without departing from the basic scope thereof, and the scope thereof is determined by the claims that follow.

We claim:

1. A method of forming a layer on a substrate, comprising:
   delivering a precursor to a process region of a plasma process chamber; and
   generating a plasma comprising the precursor over the substrate positioned on a substrate support surface of a substrate support disposed in the process region of the process chamber by delivering an RF power at a first RF frequency and a magnitude to a first electrode, wherein:
   the generated plasma causes an RF current to flow from a second electrode disposed within the substrate support to a first conductor, the RF current then flows from the first conductor through an LC resonant circuit to a second conductor and a first capacitor that has a first capacitance, the second conductor and the first capacitor are both coupled in parallel to ground, the first conductor is capacitively coupled to ground through a second capacitance, and the magnitude of the RF power at the first RF frequency is greater than 4.5 kW.

2. The method of claim 1, wherein the first RF frequency is 13.56 MHz or greater, and the magnitude of the RF power is greater than 6.5 kW.

3. The method of claim 1, wherein a ratio of a pressure (Torr) to the magnitude of the RF power (W) is between about 0.0020 to about 0.0035.

4. The method of claim 1, wherein a ratio of a top flow rate (sccm) to the magnitude of the RF power (W) is between about 0.5 to about 0.7.

5. The method of claim 1, wherein the precursor is selected from the group consisting of $C_2H_4$, He, $N_2$, $NH_3$, $WF_6$, $C_3H_6$, Ar, $SiH_4$, and $H_2$.

6. The method of claim 1, wherein the RF current measured through the second conductor is about 0.5 A (rms).

7. The method of claim 1, wherein the second electrode is made of RF mesh.

8. The method of claim 1, wherein the second conductor and the first capacitor are coupled in parallel to ground via an RF filter housing.

9. A method of forming a layer on a substrate, comprising:
delivering a precursor to a process region of a process chamber;
applying heat to the substrate positioned on a substrate support surface of a substrate support disposed in the process region of the process chamber; and
generating a plasma comprising the precursor over the substrate positioned on the substrate support surface of the substrate support disposed in the process region of the process chamber by delivering an RF power at a frequency and a magnitude to a first electrode, wherein:
the generated plasma causes an RF current to flow from a second electrode disposed within the substrate support to a first conductor, the RF current then flows from the first conductor through an LC resonant circuit to a second conductor and a first capacitor that has a first capacitance, the second conductor and the first capacitor are both coupled in parallel to ground, the first conductor is capacitively coupled to ground through a second capacitance, and the magnitude of the RF power at the frequency is greater than 4.5 kW and a temperature of the heating sources is greater than 550 degrees Celsius.

10. The method of claim 9, wherein the magnitude of the RF power at the frequency 13.56 MHz is greater than 6.5 kW.

11. The method of claim 9, wherein a ratio of a pressure (Torr) to the magnitude of the RF power (W) is between about 0.0020 to about 0.0035.

12. The method of claim 9, wherein a ratio of a top flow rate (sccm) to the magnitude of the RF power (W) is between about 0.5 to about 0.7.

13. The method of claim 9, wherein the precursor is selected from the group consisting of $C_2H_4$, He, $N_2$, $NH_3$, $WF_6$, $C_3H_6$, Ar, $SiH_4$, and $H_2$.

14. The method of claim 9, wherein the RF current measured through the second conductor is about 0.5 A (rms).

15. The method of claim 9, wherein the second electrode is made of RF mesh.

16. The method of claim 9, wherein the second conductor and the first capacitor are coupled in parallel to ground via an RF filter housing.

17. A method of forming a layer on a substrate, comprising:
(a) delivering a precursor to a process region of a process chamber;
(b) applying heat to the substrate positioned on a substrate support disposed in the process region of the process chamber; and
(c) generating a plasma comprising the precursor over the substrate positioned on the substrate support disposed in the process region of the process chamber by delivering an RF power at a frequency and a magnitude to a first electrode, wherein:
the generated plasma causes an RF current to flow from a second electrode disposed within the substrate support to a first conductor, the RF current then flows from the first conductor through an LC resonant circuit to a second conductor and a first capacitor that has a first capacitance, the second conductor and the first capacitor are both coupled in parallel to ground, the first conductor is capacitively coupled to ground through a second capacitance, and the magnitude of the RF power at the frequency is greater than 4.5 kW and a temperature of the heating sources is greater than 550 degrees Celsius;
(d) turning off the RF power; and
(e) repeating processes (a)-(d) more than two times.

18. The method of claim 17, wherein the magnitude of the RF power at the frequency 13.56 MHz is greater than 6.5 kW.

19. The method of claim 17, wherein a ratio of a pressure (Torr) to the magnitude of the RF power (W) is between about 0.0020 to about 0.0035.

20. The method of claim 17, wherein a ratio of a top flow rate (sccm) to the magnitude of the RF power (W) is between about 0.5 to about 0.7.

21. The method of claim 17, wherein the precursor is selected from the group consisting of $C_2H_4$, He, $N_2$, $NH_3$, $WF_6$, $C_3H_6$, Ar, $SiH_4$, and $H_2$.

22. The method of claim 17, wherein the RF current measured through the second conductor is about 0.5 A (rms).

23. The method of claim 17, wherein the second conductor and the first capacitor are coupled in parallel to ground via an RF filter housing.

* * * * *